United States Patent [19]
Gardner et al.

[11] Patent Number: 5,963,810
[45] Date of Patent: Oct. 5, 1999

[54] SEMICONDUCTOR DEVICE HAVING NITROGEN ENHANCED HIGH PERMITTIVITY GATE INSULATING LAYER AND FABRICATION THEREOF

[75] Inventors: Mark I. Gardner, Cedar Creek; Mark C. Gilmer, Austin; Thomas E. Spikes, Jr., Round Rock, all of Tex.

[73] Assignee: Advanced Micro Devices, Austin, Tex.

[21] Appl. No.: 08/993,414

[22] Filed: Dec. 18, 1997

[51] Int. Cl.$^6$ ................................................. H01L 21/336
[52] U.S. Cl. ............................................................ 438/287
[58] Field of Search ..................................... 438/287–288, 438/591, 770, 305, 306, 513, 636, 769, 785

[56] References Cited

U.S. PATENT DOCUMENTS 5,834,353  11/1998  Wu .......................................... 438/287

OTHER PUBLICATIONS

U.S. application serial No. 08/920,384, filed Aug. 29, 1997.

*Primary Examiner*—Charles Bowers
*Assistant Examiner*—Craig Thompson
*Attorney, Agent, or Firm*—Merchant & Gould P.C.

[57] ABSTRACT

A semiconductor device having a nitrogen enhanced high permittivity gate insulating layer and a process for manufacturing such a device is provided. Consistent with one embodiment, a high permittivity gate insulating layer is formed over a substrate using a nitrogen bearing gas. The gate insulating layer has a dielectric constant of at least 20. At least one gate electrode is formed over the high permittivity gate insulating layer. An optional nitride capping layer can be formed between the high permittivity gate insulating layer and the gate electrode. The nitrogen bearing gas may include one or more nitrogen bearing species, such as NO, $NF_3$ or N2, for example. The use of nitrogen in the formation of a high permittivity gate insulating layer can, for example, reduce oxidation of the high permittivity layer and increase the ability to control the characteristics of the gate insulating layer.

20 Claims, 3 Drawing Sheets

SEMICONDUCTOR DEVICE HAVING NITROGEN ENHANCED HIGH PERMITTIVITY GATE INSULATING LAYER AND FABRICATION THEREOF

FIELD OF THE INVENTION

The present invention is directed generally to semiconductor devices and, more particularly, to a semiconductor device having a nitrogen enhanced high permittivity gate insulating layer and a process for fabrication such a device.

BACKGROUND OF THE INVENTION

Over the last few decades, the electronics industry has undergone a revolution by the use of semiconductor technology to fabricate small, highly integrated electronic devices. The most common semiconductor technology presently used is silicon-based. A large variety of semiconductor devices have been manufactured having various applicability and numerous disciplines. One such silicon-based semiconductor device is a metal-oxide-semiconductor (MOS) transistor.

The principal elements of a typical MOS semiconductor device are illustrated in FIG. 1. The device generally includes a gate electrode 103, which acts as a conductor, to which an input signal is typically applied via a gate terminal (not shown). Heavily doped source/drain regions 105 are formed in a semiconductor substrate 101 and are respectively connected to source and drain terminals (not shown). A channel region 107 is formed in the semiconductor substrate 101 beneath the gate electrode 103 and separates the source/drain regions 105. The channel is typically lightly doped with a dopant type opposite to that of the source/drain regions 105. The gate electrode 103 is physically separated from the semiconductor substrate 101 by a gate insulating layer 109, typically an oxide layer such as $SiO_2$. The insulating layer 109 is provided to prevent current from flowing between the gate electrode 103 and the source/drain regions 105 or channel region 109.

In operation, an output voltage is typically developed between the source and drain terminals. When an input voltage is applied to the gate electrode 103, a transverse electric field is set up in the channel region 107. By varying the transverse electric field, it is possible to modulate the conductance of the channel region 107 between the source region/drain regions 105. In this manner an electric field controls the current flow through the channel region 107. This type of device is commonly referred to as a MOS field-effect-transistors (MOSFET).

Semiconductor devices, like the one described above, are used in large numbers to construct most modern electronic devices. In order to increase the capability of such electronic devices, it is necessary to integrate even larger numbers of such devices into a single silicon wafer. As the semiconductor devices are scaled down (i.e., made smaller) in order to form a larger number of devices on a given surface area, the structure of the devices and fabrication techniques used to make such devices must be altered.

One important step in the manufacture of MOS devices is the formation of the gate insulating layer. The gate insulating layer is typically formed by growing an oxide, typically $SiO_2$, over the surface of the substrate 101. It is important to carefully control the growth of the gate oxide layer because the thickness and uniformity of the gate oxide layer can significantly impact the overall operation of the device being formed. For example, the drive current in a MOS transistor is inversely proportional to the gate oxide thickness at a given set of terminal voltages. Accordingly, it is normally desired to increase the drive current of the transistor by making the gate oxide as thin as possible, taking into consideration the oxide breakdown and reliability considerations of the process and technology being used.

The above described conventional techniques for forming gate oxide layers impose limitations on the minimum thickness of the gate oxide layer and on the ability to control the uniformity of the gate oxide layer. As the thresholds for minimum thickness and uniformity control are reached, the ability to further scale down the semiconductor devices is hindered.

SUMMARY OF THE INVENTION

Generally, the present invention relates to a semiconductor device having a nitrogen enhanced high permittivity gate insulating layer and a process for manufacturing such a device. The use of nitrogen in the formation of a high permittivity gate insulating layer can, for example, reduce oxidation of the high permittivity layer and increase the ability to control the characteristics of the gate insulating layer. Consistent with the present invention, a semiconductor device is formed by forming a high permittivity gate insulating layer over a substrate using a nitrogen bearing gas. The gate insulating layer has a dielectric constant of at least 20. At least one gate electrode is formed over the high permittivity gate insulating layer. An optional nitride capping layer can be formed between the high permittivity gate insulating layer and the gate electrode. The nitride layer and high permittivity gate insulating layer may, for example, be formed in-situ. The nitrogen bearing gas may include one or more nitrogen bearing species, such as NO, $NF_3$ or $N_2$, for example.

A semiconductor fabrication process in accordance with another embodiment of the invention includes forming a layer a nitride over a substrate by sputter deposition in a reaction chamber and forming a high permittivity gate insulating layer over the nitride layer by sputter deposition using the same reaction chamber. The gate insulating layer has a dielectric constant of at least 20. Finally, at least one gate electrode is formed over the high permittivity gate insulating layer.

The above summary of the present invention is not intended to describe each illustrated embodiment or every implementation of the present invention. The figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
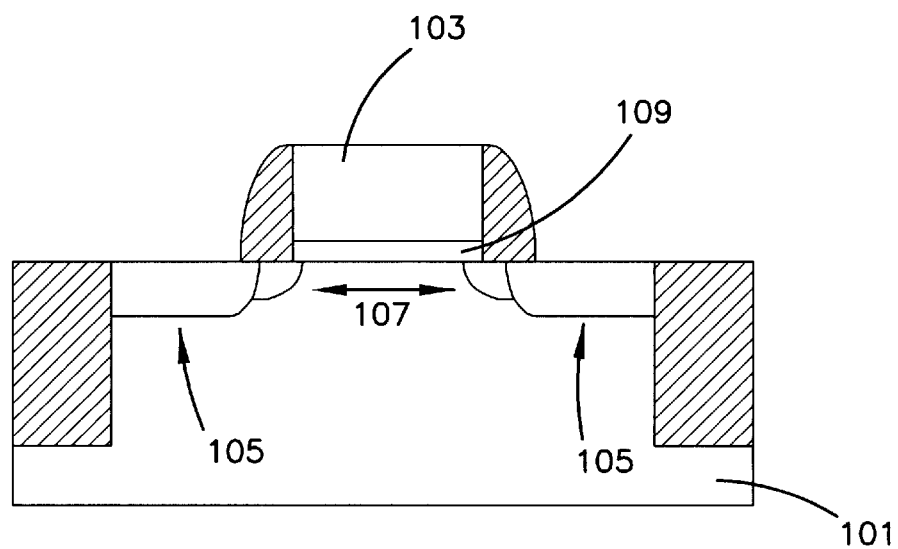
FIG. 1 illustrates a conventional MOS device.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION OF THE VARIOUS EMBODIMENTS

The present invention is believed to be applicable to a number of semiconductor devices which have a gate electrode disposed on a gate insulating layer. The invention has been found to be particularly advantageous in applications where it is desirable to form a gate insulating layer used in a MOS device, such as a PMOS, NMOS, CMOS, or BiC-MOS device. While the present invention is not so limited, an appreciation of various aspects of the invention is best gained through a discussion of various application examples of processes used to form such semiconductor devices.

Generally, the exemplary processes discussed below illustrate a variety of techniques for forming a semiconductor device having a nitrogen-enhanced relatively high permittivity gate insulating layer. The dielectric constant (i.e., permittivity) of the high permittivity gate insulating layer varies depending on the type of material used. The dielectric constant of the high permittivity gate insulating layer is typically greater than that of silicon dioxide (dielectric constant of about 4.2) normally used to form conventional gate insulating layers. Such high permittivity materials include, for example, barium strontium titanate (BST) ($Ba_{1-x}Sr_xO_3$) having dielectric constant between about 20 to 200, tantalum oxide ($Ta_xO_y$) having a dielectric constant ranging from about 20 to 200, lead zinc niobate (PZN) ($PbZn_xNb_{1-x}O_3$) having a dielectric constant of about 7,333 where $x=⅓$ and lead scandium tantalum oxide (PST) ($PbSc_xTa_{1-x}O_3$) having a dielectric constant of about 3,000 where $x=½$. It should be appreciated that the dielectric constant values given above are approximately only and can vary with the process techniques used to form and measure the permittivity of the materials. A more detailed discussion of the formation of gate insulating layers using relatively high permittivity materials and the types of high permittivity materials which may be used are provided in U.S. patent application Ser. No. 08/920,384, entitled "Semiconductor Device Having High Permittivity Gate Insulating Layer And Method Of Manufacturing Thereof," filed Aug. 29, 1997, the contents of which are herein incorporated by reference.

Figure 2A:
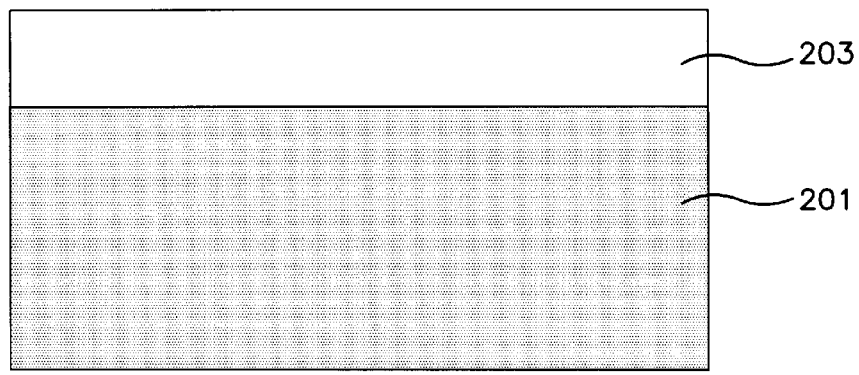
FIGS. 2A–2C illustrate an exemplary fabrication process in accordance with an embodiment of the invention.
Figure 2B:
Figure 2C:
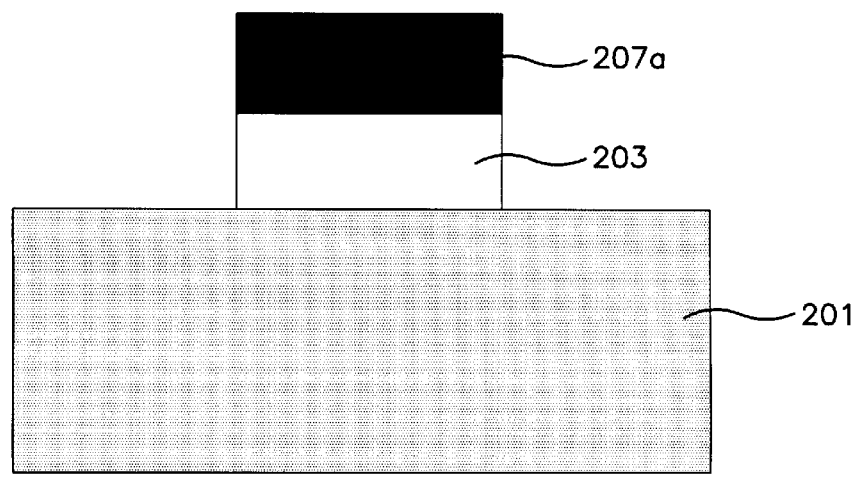

FIGS. 2A–2C illustrate an exemplary process for fabricating a semiconductor device having an nitrogen-enhanced high permittivity gate insulating layer. In FIG. 2A, a relatively high permittivity gate insulating layer 203 is formed over a silicon substrate 201 using a nitrogen bearing gas. The high permittivity gate insulating layer may be formed from a number of different oxides using, for example, deposition techniques. The nitrogen-bearing gas may include one or more nitrogen-bearing species such as NO, $NF_3$, and $N_2$, for example.

In one particular embodiment, the high permittivity gate insulating layer 203 is formed by jet vapor deposition of PZN or PST in an NO gas. The NO gas generally nitrides the PZN or PST oxide. By nitrating the PZN or PST, leakage current can be reduced and oxidation of the PST or PZN material can also be reduced. In another embodiment, the high permittivity gate insulating layer 203 is formed by metal-organic chemical vapor deposition (MOCVD) of PZN or PST in an NO gas. While not illustrated, the deposition of PZN or PST in an NO gas typically forms a thin oxynitride layer between the substrate surface and the nitride PZN or PST high permittivity gate insulating layer 203.

The thickness of the high permittivity gate insulating layer 203 is selected in consideration of the desired properties of the gate insulating layer 203 as well as in consideration of reliability concerns. Exemplary thicknesses range from about 100 to 3000 Å. While these thicknesses are substantially thicker than present $SiO_2$ gate oxide thicknesses, it should be appreciated that the equivalent $SiO_2$ thickness of the high permittivity gate insulating layer 203 can be lower than conventional $SiO_2$ gate insulating layers. For example, 1000 Å of a PST oxide having a dielectric constant of about 3,000 is equivalent to 1.4 Å of silicon dioxide having a dielectric constant of 4.2.

A gate electrode layer 207 is then formed over the high permittivity gate insulating layer 203. The resultant structure is illustrated in FIG. 2B. The gate electrode layer 207 may be formed by, for example, depositing polysilicon, amorphous silicon, or a metal (e.g., tungsten or copper) using known techniques. The thickness of the gate electrode layer 207 is selected in consideration of the desired thickness of the gate electrode/high permittivity gate insulating layer stack. Exemplary polysilicon or amorphous silicon thicknesses can range from about 200 to 3000 Å, while metal thickness are generally somewhat less. While the present invention generally provides a much thicker gate insulating layer than conventional techniques, thinner conductive layers may be used to provide comparable gate electrode/insulating layer stack thicknesses if desired.

Portions of the gate electrode layer 207 are selectively removed to form gate electrodes (only one of which is shown), as illustrated in FIG. 2C. Removal of the gate electrode layer 207 may be performed using, for example, known etching techniques. Typically, the formation of the gate electrode 207a involves removal of the high permittivity gate insulating layer 203 from active regions of the substrate 201 adjacent the gate electrode 207A. Removal of the gate insulating layer 203 may, for example, be performed using known etching techniques such as plasma etching.

Where the gate electrode layer is formed from a silicon, such as polysilicon or amorphous silicon, a thin nitrogen-bearing dielectric layer may be formed over the high permittivity gate insulating layer 203. The thin nitrogen-bearing dielectric layer may, for example, be a nitride layer. The nitride layer may be formed using, for example, well-known jet vapor deposition techniques. The thickness of the nitrogen-bearing dielectric layer is typically minimized. Suitable thicknesses of a jet nitride capping layer range from 7 to 12 Å for many applications.

Advantageously, the thin nitrogen-bearing dielectric layer may be formed in-situ (i.e., within the same reaction chamber) with the high permittivity gate insulating layer 203. For example, both the thin nitrogen-bearing dielectric layer and the high permittivity gate insulating layer 203 may be formed using a jet vapor deposition process within the same reaction chamber. Typically, the reaction chamber is purged with an inert gas such as nitrogen or argon between the two deposition processes.

The nitrogen-bearing capping layer can enhance transistor performance by, for example, reducing oxidation of the gate electrode 207a by the high permittivity gate insulating layer 203 during subsequent processing. The nitride capping layer may also enhance device performance by, for example, by inhibiting the diffusion of dopants used to dope the silicon gate electrode layer into the high permittivity layer 203. Absent the thin nitride-bearing capping layer, the silicon gate electrode may be oxidized by the oxygen in the high permittivity gate insulating layer 203 and the effective thickness of the gate insulating layer 203 may increased.

Fabrication may continue with well-known processes, such as spacer formation, source/drain implants, silicidation, and contact formation to form the ultimate device structure.

Using a high permittivity material to form a gate insulating layer of a semiconductor device has a number of advantages. As noted above, the equivalent $SiO_2$ thickness of the gate insulating layer can be reduced as compared to gate oxides formed using conventional techniques. The scaled thickness of the gate insulating layer enhances device performance by, for example, increasing drive current of the device. Moreover, due to the greater gate insulator thicknesses involved, the above process allows the uniformity of the gate insulating layer to be controlled with greater precision than $SiO_2$ gate insulating layers formed using conventional techniques.

Another advantage of the above-described fabrication process in which nitrogen is incorporated results from the presence of nitrogen in the gate insulating layer. The presence of nitrogen in the gate insulating layer improves the reliability and characteristics of the ultimately produced semiconductor device. For example, nitrogen in the gate insulating layer of a semiconductor device serves to inhibit oxidation of the high permittivity layer during subsequent processing (e.g., during the source/drain anneal). Moreover, nitrogen-bearing layers between the high permittivity layer and the substrate or gate electrode further inhibit such oxidation.

Figure 3A:
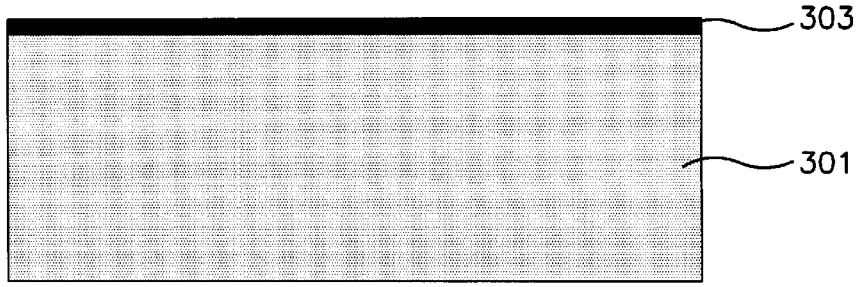
FIGS. 3A–3D illustrate an exemplary fabrication process in accordance with another embodiment of the invention.

As described above, using high permittivity material to form a gate insulating layer provides improved performance and reliability. FIGS. 3A through 3D illustrate another fabrication process in accordance with an embodiment of the invention in which a high permittivity gate insulating layer is formed using a sputter deposition technique. In FIG. 3A, a thin nitride layer 303 is formed over a silicon substrate 301. The thin nitride layer 303 may, for example, be formed using a sputter deposition process. Sputtering nitride typically involves making a plasma solution of nitrogen gas to provide ionized nitrogen atoms, accelerating the atoms toward a silicon target and allowing the silicon nitride by product to deposit on the surface of the substrate. The sputtered deposition process advantageously provides a very slow deposition rate and allows for enhanced control over the thickness of the thin deposition silicon nitride layer 303. Moreover, the sputter nitride deposition process is typically a room temperature process. For example, the chamber used in the sputtering process operates at room temperature and at about 10E–8 torr core pressure.

The thickness of the nitride layer 303 is typically minimized. The use of a sputter deposition process described above allows for relatively thin layer of nitride to be deposited. Using the sputter deposition technique, nitride layer thicknesses ranging from about 5 to 15 Å may be provided.

Figure 3B:
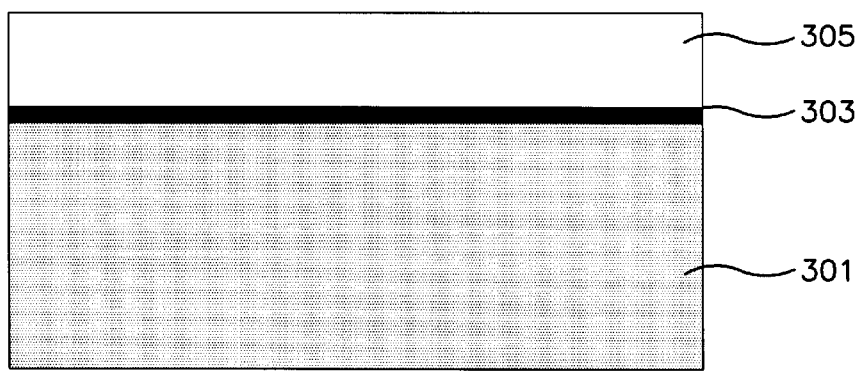

A high permittivity layer 305 is formed over the thin nitride layer 303, as illustrated in FIG. 3B. The high permittivity layer 305 may be formed from a number of different materials as discussed above. In one particular embodiment, the high permittivity layer 305 is formed using a sputter deposition process. Advantageously, a sputtered high permittivity layer 305 may be formed in-situ with (i.e., within the same reaction chamber as) a sputtered nitride layer. In-situ sputtered deposition of the high permittivity layer and the nitride layer typically involves purging the sputter deposition chamber and changing the type of plasma solution and target used in the sputter deposition process. Typically, an inert gas such as argon or nitrogen is used purge the chamber.

Figure 3C:
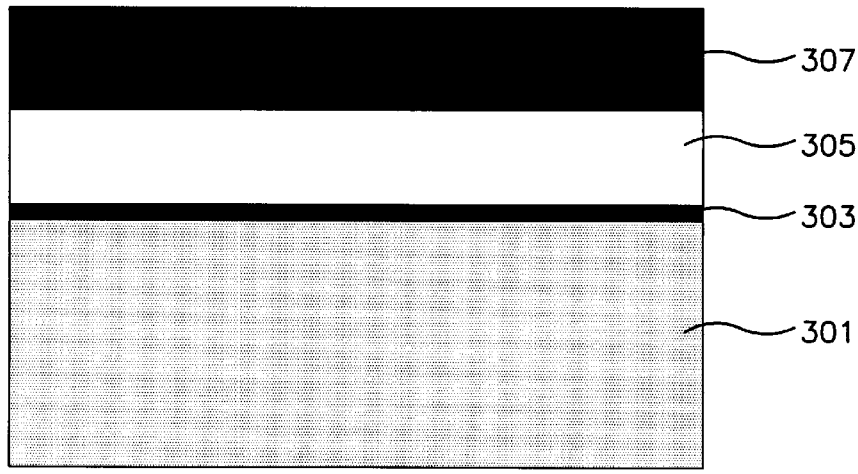
Figure 3D:
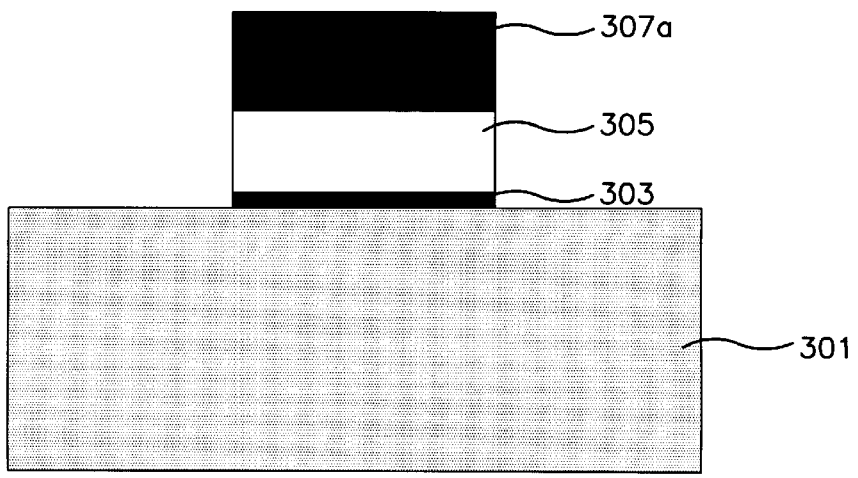

A gate electrode layer 307 is then formed over the high permittivity gate insulating layer 303. The resultant structure is illustrated in FIG. 3C. Portions of the gate electrode layer 307 are selectively removed to form gate electrodes (only one of which is shown), as illustrated in FIG. 3D. Formation and removal of the gate electrode layer 307 may be performed using, for example, known deposition and plasma etching techniques. Typically, the formation of the gate electrode 307a involves removal of the high permittivity gate insulating layer 303 from active regions of the substrate 301 adjacent the gate electrode 307A, as discussed above. Fabrication may continue with well-known processes, such as spacer formation, source/drain implants, silicidation, and contact formation to form the ultimate device structure.

A nitride capping layer may optionally be formed over the high permittivity layer 305 prior to forming the gate electrode layer 307. The use of a nitride capping layer is particularly advantageous when the gate electrode layer is formed from silicon (e.g., polysilicon or amorphous silicon) as the nitride capping layer can, for example, prevent subsequent oxidation of the silicon gate electrode layer by the high permittivity layer. The nitride capping layer may also enhance device performance by, for example, by inhibiting the diffusion of dopants used to dope the silicon gate electrode layer into the high permittivity layer 305.

In one particular embodiment, a nitride capping layer is formed in-situ with the high permittivity layer 305 and the nitride insulating layer 303. Again, the in-situ deposition of this nitride capping layer with the previously formed dielectric layers typically involves purging the sputter deposition chamber and changing the plasma solution to a nitrogen plasma solution and changing the sputter deposition target to a silicon target. Advantageously, the in-situ sputter deposition of the nitride capping layer, high permittivity layer, and thin nitride layer allows for near room temperature processing which further inhibits the ability of the high permittivity layer to oxidize.

The thickness of the nitride capping layer is typically minimized. Again, a sputtered nitride layer advantageously allows controllable and thin nitride layers to be formed. Using sputter deposition techniques, nitride layer having a thickness ranging from about 5 to 15 Å may, for example, be formed.

Using the above process, a high permittivity gate insulating layer can be layered between silicon nitride layers. This provides a robust gate insulating layer with reduced equivalent silicon dioxide thicknesses. In particular, the lower silicon nitride layer 403 provides a more receptive surface on which the high permittivity gate insulating layer 305 is disposed. The upper silicon nitride layer 407 provides additional advantages. When used with a polysilicon gate electrode, the upper silicon nitride layer 407 tends to inhibit oxidation of the gate electrode during subsequent processing. The capping layer can also inhibit the penetration of a doping agent (such as boron) into and through the high permittivity gate insulating layer. This increases the reliability and performance of the gate insulating layer.

As noted above, the present invention is applicable to fabrication of a number of different devices where the advantages of a nitrogen-enhanced high permittivity gate insulating layer are desired. Accordingly, the present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art upon review of the present specification. The claims are intended to cover such modifications and devices.

We claim:

1. A process of forming a semiconductor device, comprising:

forming a high permittivity gate insulating layer over a substrate using a nitrogen bearing gas, the gate insulating layer having a dielectric constant at least 20; and forming at least one gate electrode over the high permittivity gate insulating layer.

2. The process of claim 1, wherein forming the high permittivity gate insulating layer further includes forming a nitrogen bearing layer between the high permittivity gate insulating layer and the substrate.

3. The process of claim 2, wherein the nitrogen bearing layer is a nitrogen bearing oxide.

4. The process of claim 1, further including forming a nitride layer between the high permittivity gate insulating layer and the gate electrode.

5. The process of claim 4, wherein the nitride layer and high permittivity gate insulating layer are formed in-situ.

6. The process of claim 5, wherein:

forming the high permittivity gate insulating layer includes depositing a high permittivity material in a reaction chamber using jet vapor deposition techniques; and forming the nitride layer includes depositing a nitride in the same reaction chamber using jet vapor deposition techniques.

7. The process of claim 6, further including purging the reaction chamber between forming the high permittivity gate insulating layer and forming the nitride layer.

8. The process of claim 4, wherein the gate electrode is formed from a silicon.

9. The process of claim 1, wherein the gate electrode is formed from a metal.

10. The process of claim 1, wherein forming the high permittivity gate insulating layer includes metal-organic chemical deposition of a high permittivity material.

11. The process of claim 1, wherein the high permittivity layer has a thickness ranging from about 100 to 3000 angstroms.

12. The process of claim 1, wherein the high permittivity gate insulating layer is formed from PZN.

13. The process of claim 1, wherein the high permittivity gate insulating layer is formed from PST.

14. The process of claim 1, wherein the nitrogen bearing gas includes NO.

15. The process of claim 1, wherein the nitrogen bearing gas includes one or more of NO, $NF_3$, and $N_2$.

16. A process of fabricating a semiconductor device, comprising:

forming a layer of nitride over a substrate by sputter deposition in a reaction chamber;

forming a high permittivity gate insulating layer over the nitride layer by sputter deposition using the same reaction chamber, the gate insulating layer having a dielectric constant at least 20; and forming at least one gate electrode over the high permittivity gate insulating layer.

17. The process of claim 16, further including purging the reaction chamber between forming the high permittivity gate insulating layer and forming the nitride layer.

18. The process of claim 16, further including forming a nitride capping layer over the high permittivity gate insulating layer prior to forming the gate electrode.

19. The process of claim 18, wherein the nitride capping layer is formed by sputter deposition.

20. The process of claim 18, wherein the first layer of nitride, high permittivity gate insulating layer and nitride capping layer are deposited in the same reaction chamber.

* * * * *

UNITED STATES PATENT AND TRADEMARK OFFICE
CERTIFICATE OF CORRECTION

PATENT NO. : 5,963,810
DATED : October 5, 1999
INVENTOR(S) : Gardner et al.

It is certified that error appears in the above-identified patent and that said Letters Patent is hereby corrected as shown below:

Column 3,
Line 34, "approximately" should read -- approximate --.
Lines 45, 56, 62 and 63, "an" should read -- a --.

Column 4,
Line 58, please delete the second occurrence of "by".

Column 5,
Line 65, before "purge", please insert -- to --.

Signed and Sealed this

Ninth Day of July, 2002

Attest:

JAMES E. ROGAN
Attesting Officer   Director of the United States Patent and Trademark Office